United States Patent [19]
Laplace et al.

[11] Patent Number: 5,455,505
[45] Date of Patent: Oct. 3, 1995

[54] REMOVABLE FIELD PROGRAMMABLE DATA MEMORY STORAGE MODULE

[75] Inventors: Carl J. Laplace, Raleigh; John J. Trainor, Wake Forest, both of N.C.; Michael Bellin, Brandon, Miss.

[73] Assignee: Siemens Energy & Automation, Inc., Alpharetta, Ga.

[21] Appl. No.: 101,133

[22] Filed: Aug. 2, 1993

[51] Int. Cl.⁶ ............................ G05F 1/20; G05F 1/30
[52] U.S. Cl. ................................. 323/343; 364/492
[58] Field of Search ............................. 323/255, 256, 323/257, 258, 340, 341, 343; 364/483, 492; 365/228, 229

[56] References Cited

U.S. PATENT DOCUMENTS

| | | | |
|---|---|---|---|
| 4,419,619 | 12/1983 | Jindrick et al. | 323/257 |
| 4,612,617 | 9/1986 | Laplace, Jr. et al. | 364/483 |
| 5,267,211 | 11/1993 | Kobayashi et al. | 365/228 |

OTHER PUBLICATIONS

Personal Computer Memory Card International Association; pp. 1–4; 1992.

Primary Examiner—Peter S. Wong

[57] ABSTRACT

A controller for a line regulation device such as a voltage regulator is provided with an interface to a removable memory module. The memory module is preferably of the memory card type which can be carried by a field engineer in a clothing pocket. When the memory card is inserted into an externally accessible slot in the controller, its presence is signaled to the controllers microprocessor. In response, the microprocessor reads user selected control parameters which are entered via the controller's front panel. Depending on the control parameters, the microprocessor updates the programming code in its internal memory, executes the code stored in the memory card while it is present but does not update its internal memory, or dumps selected status information to the memory card so that it can be analyzed at a different location.

12 Claims, 5 Drawing Sheets

5,455,505

REMOVABLE FIELD PROGRAMMABLE DATA MEMORY STORAGE MODULE

BACKGROUND OF THE INVENTION a. Field of the Invention

This invention relates to circuit protection devices and related control systems.

b. Related Art

A step-type voltage regulator is a device which is used to maintain a relatively constant voltage level in a power distribution system. Without such a regulator, the voltage level of the power distribution system could fluxuate significantly and cause damage to electrically powered equipment.

A conventional step-type voltage regulator transformer assembly 102 and its associated controller 106 are shown in FIG. 1. The voltage regulator can be, for example, a Siemens JFR series. The windings and other internal components that form the transformer assembly 102 are mounted in an oil filled tank 108. A tap changing mechanism (not shown) is commonly sealed in a separate chamber in the tank 108.

The various electrical signals generated by the transformer are brought out to a terminal block 110 and external bushings S, SL, L for access. The terminal block is preferably covered with a waterproof housing. An indicator 112 is provided so that the position of the tap as well as its minimum and maximum positions can be readily determined.

A cabinet 114 is secured to the tank to mount and protect the voltage regulator controller 106. The cabinet 114 includes a door (not shown) and is sealed in a manner sufficient to protect the voltage regulator controller 106 from the elements. Signals carried between the transformer or tap changing mechanism and the voltage regulator controller 106 are carried via an external conduit 116.

In order for the voltage regulator transformer assembly 102 and the controller 106 to work together to maintain the proper line characteristics, the controller is commonly provided with the specifications of the transformer assembly 102. For example, information such as the transformer assembly's voltage rating, current rating, configuration and impedance characteristics may be programmed into the controller. Statistical information such as number of tap changes and temperature extremes may also be maintained by the controller so that a field engineer can determine when to change or service the voltage regulator.

SUMMARY OF THE INVENTION

According to the present invention a controller for a line control device such as a voltage regulator is provided with an interface to a removable memory module. In a preferred embodiment, the memory module is of the memory card type which can be carried by a field engineer in a clothing pocket.

When the memory card is inserted into an externally accessible slot in the controller, its presence is signaled to the controller's microprocessor. In response, the microprocessor reads user selected control parameters which are entered via the controller's front panel. Depending on the control parameters, the microprocessor performs a selected task such as updating its internally stored program code or configuration data, executing the program code from the memory card while it is present without updating its internally stored code, or writing selected information to the memory card so that it can be analyzed a different location.

BRIEF DESCRIPTION OF THE DRAWINGS

Like reference numerals appearing in more than one figure represent like elements.

DETAILED DESCRIPTION OF THE PREFERRED EMBODIMENT

An embodiment of the present invention within a voltage regulator will now be described by reference to FIGS. 2 through 5.

Figure 1:
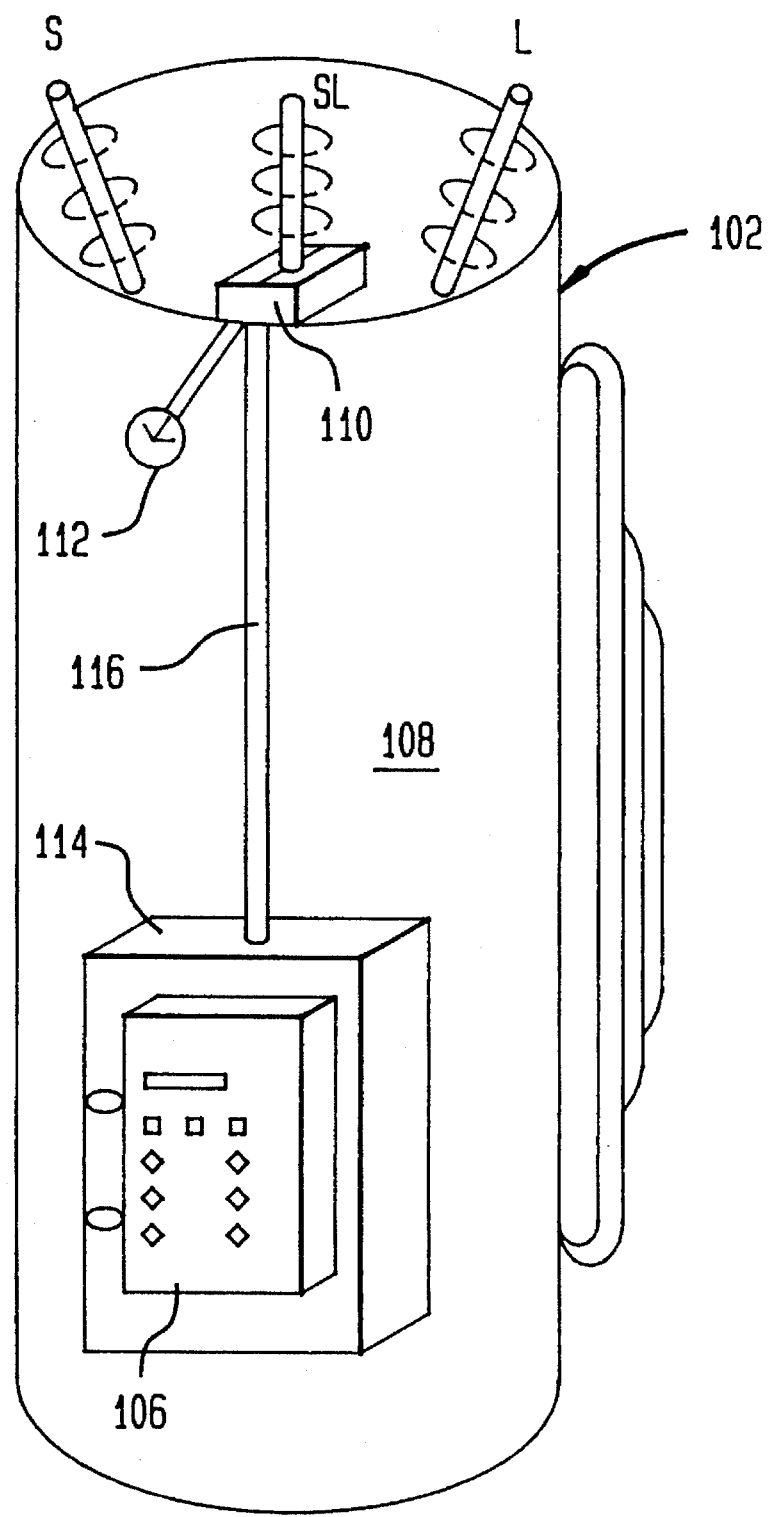
FIG. 1 shows a conventional voltage regulation system.
Figure 2:
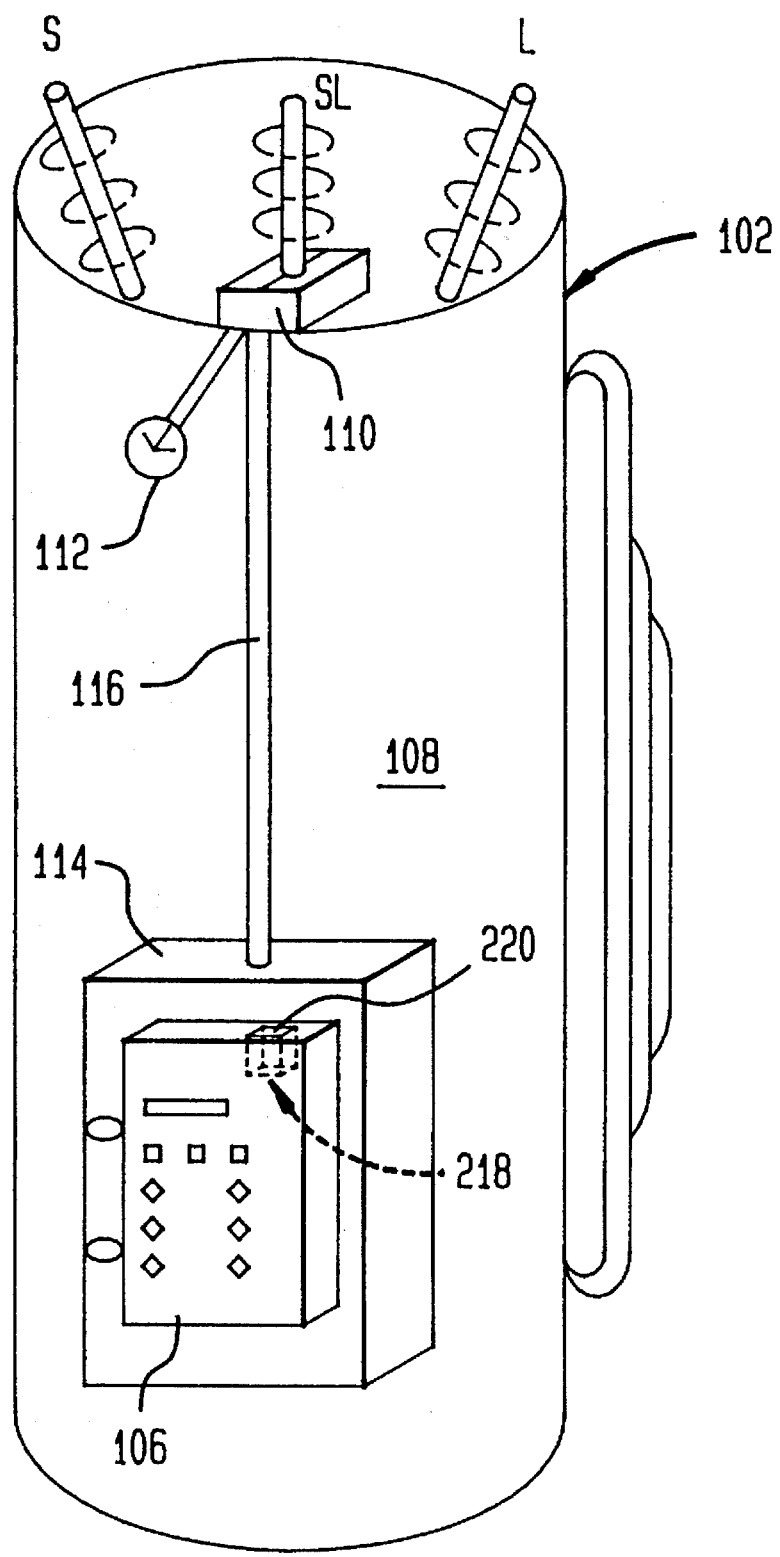
FIG. 2 shows a voltage regulation system with a controller having an externally accessible memory card port according to an embodiment of the present invention.

A step-type voltage regulator transformer assembly 102 and its associated controller 206 according to an embodiment of the present invention are shown in FIG. 2. The transformer assembly 102 is identical to the prior art step-type voltage regulator of FIG. 1, however, the associated voltage regulator controller 206 differs from the controller 106 of FIG. 1 in that has a slot for receiving a standard PCMCIA "plug-in" memory card and associated internal logic (as shown in more detail in FIGS. 3 through 5). The slot 218 provides a user with access to an internal memory card connector 220 which is electrically connected to a PCMCIA memory card interface 310 (FIGS. 3 & 4) disposed internally in the controller housing.

Figure 3:
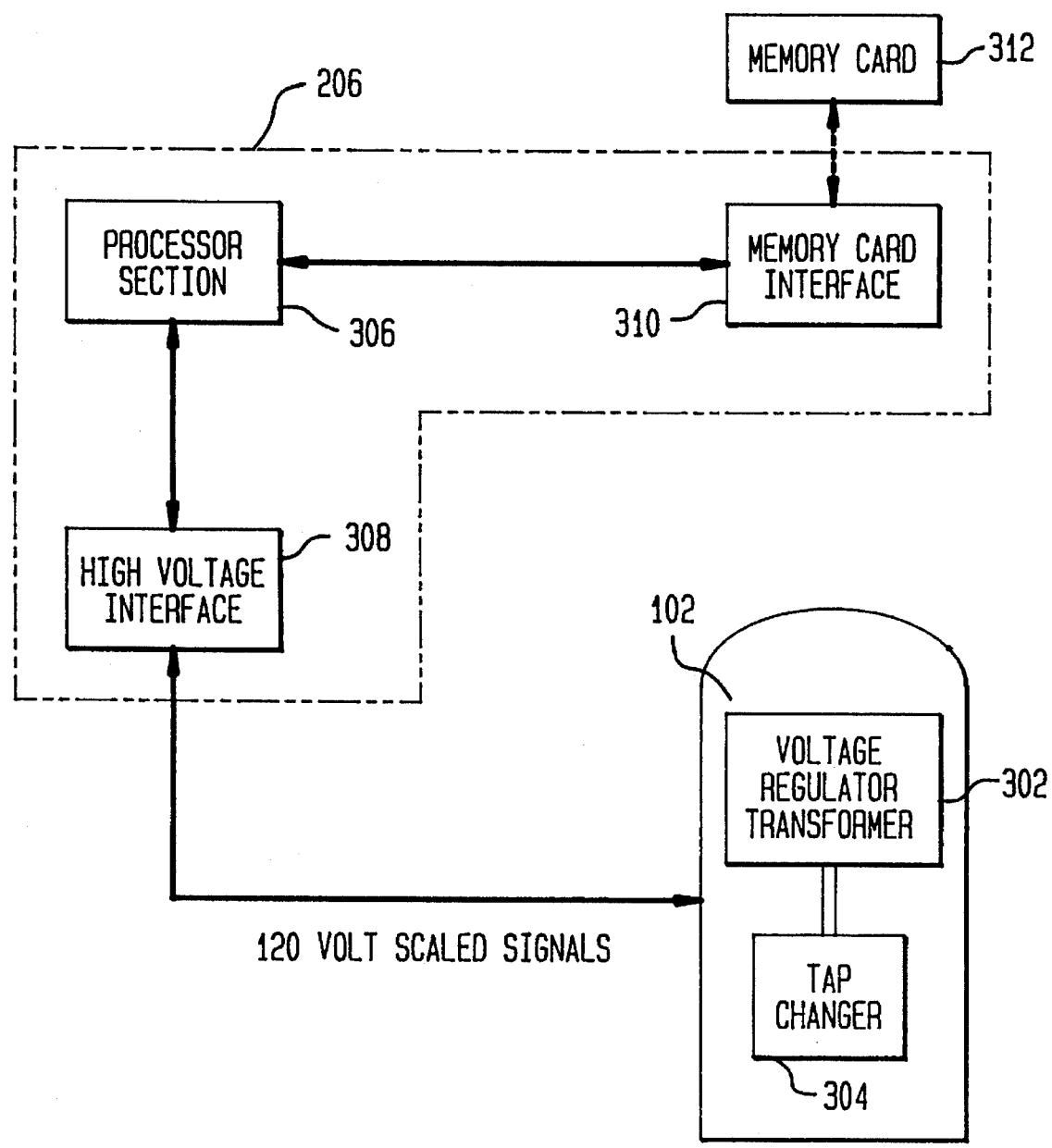
FIG. 3 is a more detailed diagram of the voltage regulator transformer assembly and controller of FIG. 2; and, FIG. 4 is a more detailed diagram of the processor board of FIG. 3 showing its connection to the memory card interface; and, FIG. 5 is a flow chart of the operation of the processor board of FIG. 4 with respect the memory card interface and memory card.

The transformer assembly 102 and voltage regulator controller 206 are illustrated in more detail in FIG. 3. The transformer assembly 102 includes a multi-tap transformer 302 and an associated tap changer 304. The tap changer 304 is controlled by the voltage regulator controller 206 based on the controller's program code and programmed configuration parameters. The voltage regulator controller 206 includes a processor section 306, a high voltage interface 308 and a memory card interface 310. The processor section 306, the high voltage interface 308 and the memory card interface 310 can be embodied on separate circuit boards.

The processor section 306 generates digital control signals based on internal program code and user selected parameters entered (by a user) via the controllers front panel. In operation, high voltage signals are generated by the transformer 302. These signals are scaled down via internal transformers (not shown) and provided to the high voltage interface 308. The high voltage interface 308, in turn, further scales the transformed down signals for reading by an analog to digital converter (shown in FIG. 4) within the processor section 306. The data fed back from the transformer 302 is used by the processor section 306 to make tap change control decisions and to generate indicators of various conditions to a user.

The memory card interface 310 provides data exchange between the processor and a removable, field programmable data memory storage module (memory card) 312. The memory card 312 has read/write capability and is used, for example, to store controller data for later retrieval, to revise the configuration parameters of the controller, or to provide additional program code so that the processor section 306 can run non-resident algorithms or perform updates or revisions to the processor's resident control program. The memory card interface 310 is preferably embodied as a Personal Computer Memory Card International Association (PCMCIA) interface. The interface 310 is electrically connected to a PCMCIA connector 220 (FIG. 2), externally accessible through the slot 218 in the controller housing. A PCMCIA standard memory card 312 can be plugged into the connecter 220 via the slot 218.

Figure 4:
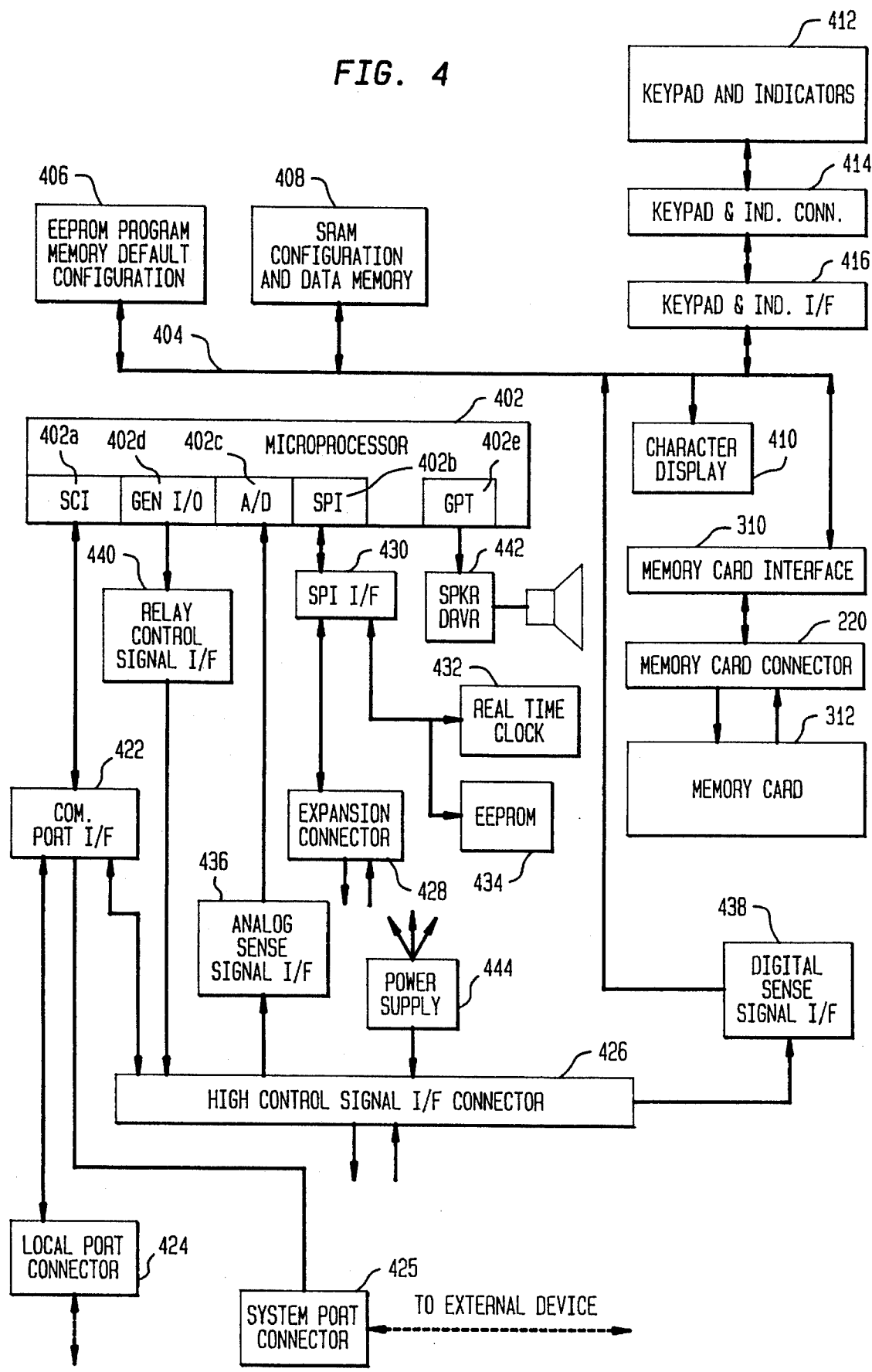

Field changes to the controllers configuration information or the processor's resident program, or uploading of data stored in controllers internal memory is accomplished by a user plugging the memory card 312 into the memory card interface 310 and invoking a command from the regulator controller's keypad 412 (FIG. 4). The memory card 312 can be left plugged in to collect data or it can be inserted briefly to transfer data to or from the controller 206. Advantageously, the memory card 312 can be easily unplugged from the external connector 220 and carried by a field engineer to another site for reprogramming or analysis of it's stored data.

A more detailed block diagram of the processor section 306 and its interconnection with the memory card interface 310 and memory card 312 is illustrated in FIG. 4.

The processor section 206 includes a microprocessor 402 (for example, a Motorola 68HC16) which is coupled to the other processor elements by way of a common bus 404. An electrically erasable programmable read only memory (EEPROM) 406 includes the microprocessor's program instructions and default configuration data.

A static random access memory (SRAM) 408 stores user programmed configuration data and includes an area for the microprocessor 402 to store working data.

The microprocessor 402 also communicates with an alphanumeric character display 410, a keypad and indicators (front panel) 412 and the memory card interface 310 of the type described with respect to FIG. 3.

The keypad/indicators 412 are coupled to the bus 404 via a connector 414 and a bus interface 416. As previously described, the memory card 312 can be coupled to the bus 404 by way of a conventional PCMCIA standard interface 310 and connector 220 which is externally mounted on the controller cabinet as illustrated in FIG. 2.

Operational parameters, setpoints and special functions including metering parameters and local operator interfacing are accessed via the keypad 412. The keypad is preferably of the membrane type however any suitable switching device can be used. The keypad provides single keystroke access to regularly used functions, plus quick access (via a menu arrangement) to all of the remaining functions.

The microprocessor 402 includes an SCI port 402a which is connected to a communication port interface 422. The communication port interface provides 422 the SCI signals to an external local port 424 and a system port 425 (both accessible on the controller's front panel). An isolated power supply for the communication port interface 422 is provided by the high voltage interface 408 via high voltage signal interface connecter 426.

The communication port interface 422 supports transfer of data in both directions, allowing the controller to be configured via a serial link, and also provides meter and status information to a connected device. In addition to supporting the configuration and data retrieval functions required for remote access, the communication port interface 422 supports uploading and/or downloading the program code for the microprocessor 402.

The communication port interface 422 can be, for example, an RS232-compatible port. The local and system port connectors 424, 425 can be used for serial communication with other apparatus, for example a palmtop or other computer. The physical interface of the local and system port connectors 424, 425 can be a 9-pin D-type connector whose pin-out meets any suitable industry standard, for example, matching the PC-AT RS232 port connector.

The microprocessor 402 also includes a SPI port 402b which is connected to an expansion connector 428 by way of an SPI interface 430 Other devices that reside on the SPI bus include a real time clock (RTC) 432 and a serial EEPROM 434. The serial EEPROM 434 stores user programmed configuration data. The user programmed configuration data is downloaded to the SRAM 432 by the microprocessor 502 when the processor section 406 is initialized. The SRAM copy is used, by the microprocessor, as the working copy of the configuration data. The real time clock 432 is programmed and read by the microprocessor 402.

The high voltage signal interface connector 426 provides a mating connection with a connector on the high voltage interface 308. Scaled analog signals from the high voltage interface 308 are provided to an A/D converter port 402c by way of an analog sense signal interface 436. The analog sense signal interface 436 low pass filters the scaled analog input signals prior to their provision to the A/D converter port 402c. Digital signals from the high voltage interface 308 are provided to the bus 544 via a digital sense signal interface 438. The digital sense signal interface 438 provides the proper timing, control and electrical signal levels for the data.

Control signals from the microprocessors general I/O port 402d are provided to the high voltage signal interface connector 426 by way of a relay control signal interface 440. The relay control signal interface converts the voltage levels of the I/O control signals to those used by the high voltage interface 408. A speaker driver 442 is connected to the GPT port 402e of the microprocessor 402. The processor section 306 also includes a power supply 444 which provides regulated power to each of the circuit elements of FIG. 4 as needed. The high voltage interface 308 provides an unregulated power supply and the main 5 volt power supply for the processor board 306.

Figure 5:
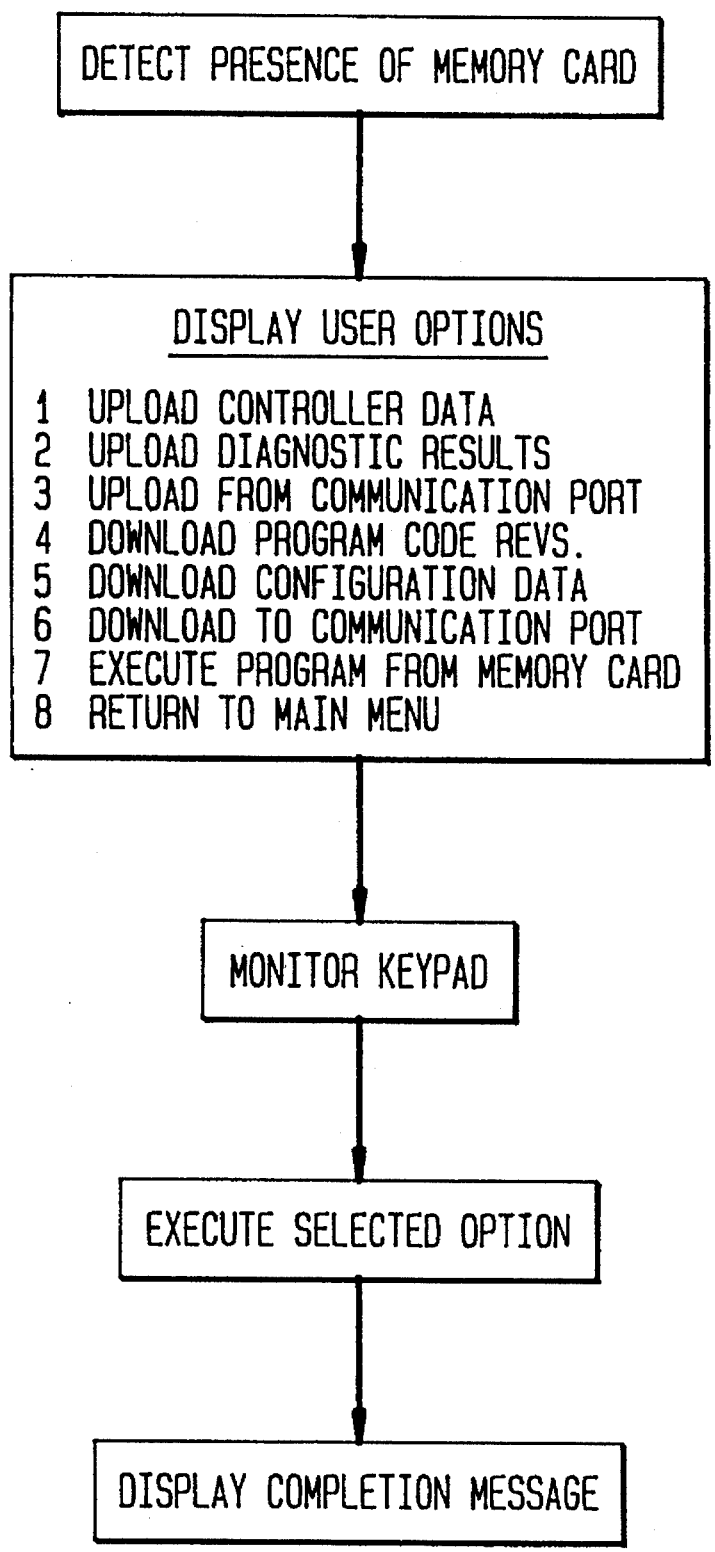

The operation of the processor section and memory card interface is illustrated in FIG. 5. The program code for detecting and handling the memory card 312 is stored in the program memory portion of the EEPROM 406.

In step 502, the microprocessor detects that a memory card 312 is plugged into the memory card interface 310. This can be accomplished in a number of ways. In one embodiment, the microprocessor 402 recognizes that a memory card 310 has been plugged into the memory card interface 312 by monitoring the bus 404 for a signal so indicating. As an alternative or additional embodiment, the microprocessor 402 can be programmed to monitor the keypad 412 for entry (by a user) of a given key sequence indicating that a memory card 310 is present.

In any event, once the presence of a memory card 312 in the connector 220 is detected, in step 504 the processor 402 displays a menu of options on the character display 410. These options include:

1 UPLOAD CONTROLLER DATA

2 UPLOAD DIAGNOSTIC RESULTS
3 UPLOAD FROM COMMUNICATION PORT
4 DOWNLOAD PROGRAM CODE REVS.
5 DOWNLOAD CONFIGURATION DATA
6 DOWNLOAD TO COMMUNICATION PORT
7 EXECUTE PROGRAM FROM MEMORY CARD
8 RETURN TO MAIN MENU

In step 506, the microprocessor 402 monitors the keypad 412 for entry of the users selection. When a selection has been entered, in step 508 the microprocessor 402 executes the selection as follows:

Options 1 through 3 are upload options. If option 1 (UPLOAD CONTROLLER DATA) has been selected, the processor reads information from the EEPROM 406 and the SRAM 408 and writes it to the memory card 312. This information includes configuration parameters such as regulator voltage and current ratings, set-points and thresholds and a program code revision identifier; statistical data such as temperature extremes and total number of tap changes; and log data including time stamped, metered parameters (e.g. tap extremes and voltage levels) monitored by the controller. If option 2 (UPLOAD DIAGNOSTIC RESULTS) is selected, the processor executes a regulator diagnostic program (stored in the EEPROM 406) and writes the results to the memory card 312. If option 3 (UPLOAD FROM COMMUNICATION PORT) is selected, the processor monitors the system port 425 for incoming data and writes the data to the memory card 312 until a predetermined number of bytes have been written (e.g. the amount of memory available in the memory card 312), until a timeout occurs, or until interrupted by the user, whichever comes first.

Options 4 through 6 are download options. If option 4 (DOWNLOAD PROGRAM CODE REVS.) is selected, the microprocessor 406 updates the program memory in the EEPROM 406 by overwriting appropriate memory locations with control program revisions stored in the memory card 312. If option 5 (DOWNLOAD CONFIGURATION DATA) is selected the microprocessor reads the data from the memory card 312 and writes it to the processor's non-volatile user configuration memory in the SPI bus EEPROM 434. It is noted here that the default configuration data in the main EEPROM 406 can be updated as part of option 4. If option 6 (DOWNLOAD TO COMMUNICATION PORT) is selected, the processor reads the data stored in the memory card 312 and writes the data to the system port 424 via the SCI bus 402a and the communications port interface 422.

If option 7 (EXECUTE PROGRAM FROM MEMORY CARD) is selected, the processor executes the data stored in the memory card 312 as program code.

If option 8 (RETURN TO MAIN MENU) is selected, the processor displays a main menu on the character display 410.

Once the selected option has been executed, in step 510 the microprocessor displays a completion message on the character display 410 and returns to a main menu.

As an alternative embodiment, the processor section 306 can be programmed to default to the memory card whenever its presence is detected. In this case, upon detection of a memory card 312 in the connector 220, the processor reads a data header (which is stored in a predetermined location in the memory card 312) to determine whether it contains program code, configuration data or both. If the memory card contains configuration data, it is downloaded to the SPI bus EEPROM 434. If the header indicates that program code is stored in the memory card 312 the program code from the memory card 312 is downloaded to the SRAM 408 and executed by the microprocessor from there.

Now that the invention has been described by way of the preferred embodiment, various modifications, enhancements and improvements which do not depart from the scope and spirit of the invention will become apparent to those of skill in the art. Thus, it should be understood that the preferred embodiment has been provided by way of example and not by way of limitation. The scope of the invention is defined by the appended claims.

We claim:

1. A controller for a line regulation device, comprising:
   a) a housing;
   b) a memory card connector for receiving a removable memory card, the memory card connector being mounted so as to be externally accessible on the housing;
   c) a memory card interface coupled to the memory card connector;
   d) processing means mounted in the housing, the processing means including:
      a processing element coupled to the memory card interface;
      a memory coupled to the processing element, the memory including: (i) means for causing the processing element to recognize when a memory card has been electrically coupled to the memory card interface, (ii) configuration data for controlling operation of the line regulation device, and (iii) means for causing the processing element to alter the configuration data with at least part of the contents of the memory card; and,
   e) means for coupling the processing element with an actuator of the line regulation device.

2. The apparatus of claim 1 wherein the line regulation device is a step-type voltage regulator transformer and the actuator is a tap changing mechanism connected the transformer.

3. The apparatus of claim 1 wherein the controller includes a keypad and wherein the controller is programmable from the keypad to do any of executing a program stored in the memory card, downloading at least a portion of the memory card contents to the memory, and uploading at least a portion of the memory to the memory card.

4. The apparatus of claim 1 wherein the controller includes means for storing statistical information concerning the line regulation device wherein the processing element includes means for downloading the statistical information to the memory card.

5. The apparatus of claim 1 wherein the processing means includes means for executing an internal diagnostic on the controller and for recording results thereof and wherein the processing element includes means for downloading the results of the internal diagnostic to the memory card.

6. The apparatus of claim 1 wherein the processing means comprises a data communication port and means for exchanging data between the data communication port and the memory card.

7. A voltage regulator controller for use with a step-type voltage regulation system, comprising:
   a) a housing;
   b) a memory card connector for receiving a removable memory card, the memory card connector being mounted so as to be externally accessible on the housing;
   c) a memory card interface coupled to the memory card connector;

d) a processor mounted in the housing and coupled to the memory card;

a memory coupled to the processor, the memory including first program code for recognizing that a memory card has been electrically coupled to the memory card interface, second program code for controlling operation of the voltage-regulator transformer and third program code means for altering the contents of the memory with at least part of the contents of the memory card; and, e) means for coupling the processing means with the voltage regulator transformer.

8. The apparatus of claim 7 wherein the third program code comprises means for altering the first program code with at least part of the contents of the memory card.

9. The apparatus of claim 7 wherein the controller includes a keypad and wherein the controller is programmable from the keypad to do any of executing a program stored in the memory card, downloading at least a portion of the memory card contents to the memory, and uploading at least a portion of the memory to the memory card.

10. The apparatus of claim 9 further comprising a non-volatile memory for storing statistical information concerning the voltage regulation system and means for downloading the statistical information to the memory card.

11. The apparatus of claim 10 wherein the controller includes third program code for executing an internal diagnostic on the voltage regulation system and for recording results thereof and means for downloading the results of the internal diagnostic to the memory card.

12. The apparatus of claim 11 wherein the controller comprises a data communication port coupled to the processor and means, coupled to the processor and the memory card interface, for exchanging data between the data communication port and the memory card.

* * * * *